(12) United States Patent
Ranade et al.

(10) Patent No.: US 6,825,066 B2
(45) Date of Patent: Nov. 30, 2004

(54) STIFFENER DESIGN

(75) Inventors: Yogendra Ranade, Fremont, CA (US);
Anand Govind, Fremont, CA (US);
Kumar Nagarajan, San Jose, CA (US);
Farshad Ghahghahi, Los Gatos, CA
(US); Aritharan Thurairajaratnam,
San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 68 days.

(21) Appl. No.: 10/308,310

(22) Filed: Dec. 3, 2002

(65) Prior Publication Data

US 2004/0105241 A1 Jun. 3, 2004

(51) Int. Cl.[7] .............................................. H01L 21/44
(52) U.S. Cl. ...................... 438/121; 438/125; 438/106; 438/107; 438/613; 438/108; 257/706; 257/701; 257/702; 257/704
(58) Field of Search ................................ 438/121, 125, 438/106, 107, 613, 108; 257/706, 701, 702, 704

(56) References Cited

U.S. PATENT DOCUMENTS

| | | | | |
|---|---|---|---|---|
| 5,631,807 A | * | 5/1997 | Griffin | ........................ 361/794 |
| 5,866,943 A | * | 2/1999 | Mertol | ......................... 257/712 |
| 5,882,459 A | * | 3/1999 | Petefish et al. | .............. 156/150 |
| 2002/0046602 A1 | * | 4/2002 | Geen et al. | ............... 73/504.02 |
| 2002/0074636 A1 | * | 6/2002 | Siu | ............................. 257/678 |
| 2004/0007768 A1 | * | 1/2004 | Byers et al. | ................. 257/666 |

* cited by examiner

*Primary Examiner*—Matthew Smith
*Assistant Examiner*—Victor V Yevsikov
(74) *Attorney, Agent, or Firm*—Luedeka, Neely & Graham, P.C.

(57) ABSTRACT

A stiffener for reinforcing a package integrated circuit. The stiffener includes a rigid planar element having a first surface for bonding to a package substrate. The rigid planar element forms a major interior aperture for receiving and surrounding an integrated circuit on all sides of the integrated circuit. The rigid planar element also forms a minor interior aperture for receiving and surrounding a secondary circuit structure on at least three sides of the secondary circuit structure. In this manner, the stiffener provides structural support to the integrated circuit package, which reduces and preferably eliminates twisting and warping of the substrate package as it heats and is subjected to other stresses. Because the major interior apertures does not need to be large enough to fit both the monolithic integrated circuit and the secondary circuit structure, there is more stiffener material available to provide structural support than there would be if the major interior aperture was large enough to fit both the monolithic integrated circuit and the secondary circuit structure.

20 Claims, 1 Drawing Sheet

STIFFENER DESIGN

FIELD

This invention relates to the field of integrated circuit fabrication. More particularly, this invention relates to integrated circuit packaging materials.

BACKGROUND

Integrated circuits are preferably packaged prior to use, to protect the integrated circuit and to more easily provide for electrical connections between the integrated circuit and the external portions of the circuit in which the integrated circuit is to be used. While the packaging materials provide these valuable function, they also tend to create other problems, which should be identified and overcome to enhance the longevity of the integrated circuit.

For example, many packaging materials tend to have relatively low thermal conductivities. When the integrated circuit is operating, thermal energy is developed by electron motion in different parts of the monolithic integrated circuit. Because the packaging materials tend to be inefficient in dissipating the thermal energy, it tends to be expressed as an increase in temperature in various parts of the integrated circuit, which localized temperature increases are typically referred to as hot spots.

Over time, the thermal energy may conduct throughout the bulk substrate material of the monolithic integrated circuit, which may then tend to be at a relatively uniform temperature. The monolithic integrated circuit thus tends to swell and contract, based at least in part upon the temperature of the substrate. The degree to which the integrated circuit swells and contracts is predominantly dependent upon the temperature coefficient of expansion of the substrate. However, the packaging materials surrounding the monolithic integrated circuit tend to have temperature coefficients of expansion that are different from that of the integrated circuit substrate. Thus, and in part because they tend to not conduct heat at the same rate as the integrated circuit substrate, the packaging materials, such as the underfill material, package substrate, and encapsulants, tend to expand and contract at a different rate and to a different degree than the integrated circuit.

With the various elements of the packaged integrated circuit expanding and contracting in different ways, as described above, stresses are set up in the packaged device. These stresses are often strong enough to twist or otherwise warp the package. As the package twists and bends to alleviate the stresses, mechanical failures may occur in the package, such as electrical connections breaking. Obviously, such conditions reduce the utile life of the packaged integrated circuit.

One method of reducing the twisting and warping of the package is to include a member inside the package that can stiffen the package to some degree. However, secondary circuit structures, other than the integrated circuit, that are mounted on the package substrate and included within the packaged integrated circuit tend to get in the way of such stiffeners and reduce their effectiveness.

What is needed, therefore, is an integrated circuit package design that can help reduce the twisting and warping of package materials due to thermal expansion and other physical stresses, while accommodating secondary structures such as on substrate capacitors and resistors.

SUMMARY

The above and other needs are met by a stiffener for reinforcing a package integrated circuit. The stiffener includes a rigid planar element having a first surface for bonding to a package substrate. The rigid planar element forms a major interior aperture for receiving and surrounding an integrated circuit on all sides of the integrated circuit. The rigid planar element also forms a minor interior aperture for receiving and surrounding a secondary circuit structure on at least three sides of the secondary circuit structure.

In this manner, the stiffener provides structural support to the integrated circuit package, which reduces and preferably eliminates twisting and warping of the substrate package as it heats and is subjected to other stresses. Because the major interior aperture does not need to be large enough to fit both the monolithic integrated circuit and the secondary circuit structure, there is more stiffener material available to provide structural support than there would be if the major interior aperture was large enough to fit both the monolithic integrated circuit and the secondary circuit structure.

In various preferred embodiments, the rigid planar element forms a plurality of minor interior apertures for receiving and surrounding a plurality of secondary circuit structures on at least three sides of each of the secondary circuit structures. The minor interior aperture formed by the rigid planar element most preferably surrounds the secondary circuit structure on all sides of the secondary circuit structure. Preferably, the stiffener is formed of metal, and most preferably is formed of copper. The stiffener is preferably about fifty millimeters square in size and about six hundred and forty-five microns in thickness, and most preferably substantially the same size as the laminate package substrate, with a thickness that is lower than the monolithic integrated circuit substrate attached to the laminate package substrate. Such a size tends to minimize the overall impact on the completed package. The major interior aperture is preferably about twenty-two millimeters or about twenty-four millimeters square in size, and the minor interior aperture is preferably about four millimeters square in size. In one embodiment the major interior aperture has beveled corners. In one embodiment the major interior aperture adjoins the minor interior aperture.

According to another aspect of the invention there is described a stiffener for reinforcing a packaged integrated circuit, where the stiffener has a rigid planar element having a first surface for bonding to a package substrate. The rigid planar element forms a major interior aperture for receiving and surrounding an integrated circuit on all sides of the integrated circuit, where the major interior aperture has beveled corners.

In yet another aspect of the invention there is described a packaged integrated circuit having a package substrate, with a monolithic integrated circuit and a secondary circuit structure mounted to the package substrate. A stiffener is mounted to the package substrate for reinforcing the packaged integrated circuit. The stiffener forms a major interior aperture for receiving and surrounding the integrated circuit on all sides of the integrated circuit, and also forms a minor interior aperture for receiving and surrounding the secondary circuit structure on at least three sides of the secondary circuit structure. A cover encloses the integrated circuit and the secondary circuit.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
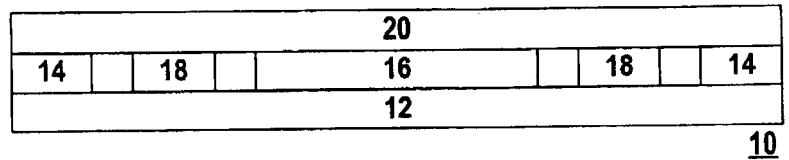
FIG. 1 is a cross sectional view of a packaged integrated circuit, showing a stiffener mounted to a package substrate, and surrounding a monolithic integrated circuit and a secondary circuit structure.

With reference now to FIG. 1 there is depicted a cross sectional view of a packaged integrated circuit 10, showing a stiffener 14 mounted to a package substrate 12, and surrounding a monolithic integrated circuit 16 and secondary circuit structures 18. A lid 20 is used to encapsulate the integrated circuit 16 and secondary circuit structures 18 to the package substrate 12. The secondary circuit structures 18 may be devices such as decoupling capacitors. The integrated circuit may be an ASIC, such as a flip chip device. It is appreciated that many other kinds of lids 20 could be employed, such as an encapsulant, and that the package may include other elements, such as a heat spreader, underfill material, and solder bumps, none of which are depicted so as to more particularly focus attention on the more important aspects of the invention.

Figure 2:
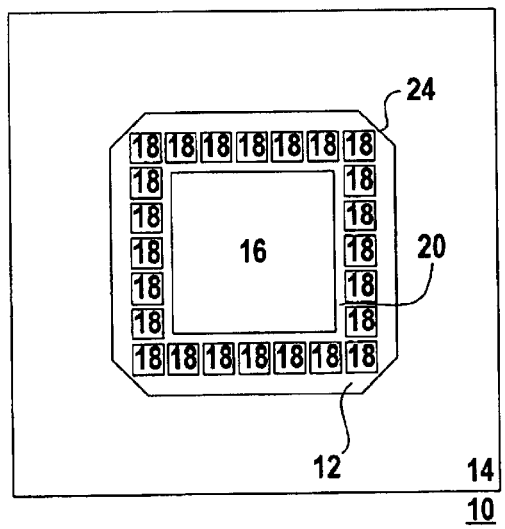
FIG. 2 is a top plan view of a first embodiment of the stiffener.

As depicted in FIG. 2, the stiffener 14 receives the integrated circuit 16 within a major interior aperture 20. The stiffener 14 preferably has as much surface area mounted to the package substrate 12 as possible, so that it can aid, to as great an extent as possible, in structurally reinforcing the packaged integrated circuit 10 against twisting and warping. Thus, the stiffener 14 is preferably formed of a rigid material such as a metal, and is most preferably formed of copper. The outside dimensions of the stiffener 14 are preferably determined by the desired size of the package, which in a most preferred embodiment is about fifty millimeters square in size. The major interior aperture 20 is preferably either about twenty-two millimeters square or twenty-four millimeters square. Most preferably the stiffener 14 is about six hundred and forty-five microns in thickness.

In the embodiment depicted in FIG. 2, the secondary circuit structures 18 also reside within the major interior aperture 20. However, rather than having square corners or slightly rounded corners, the corners of the major interior aperture 20 have bevels 24. The bevels 24 allow the stiffener 14 to have a greater amount of surface area mounted to the package substrate 12, which improves the structural strength of the integrated circuit package 10, as mentioned above. As depicted, the major interior aperture 20 surrounds the integrated circuit 16 on all sides of the integrated circuit 16.

Figure 3:
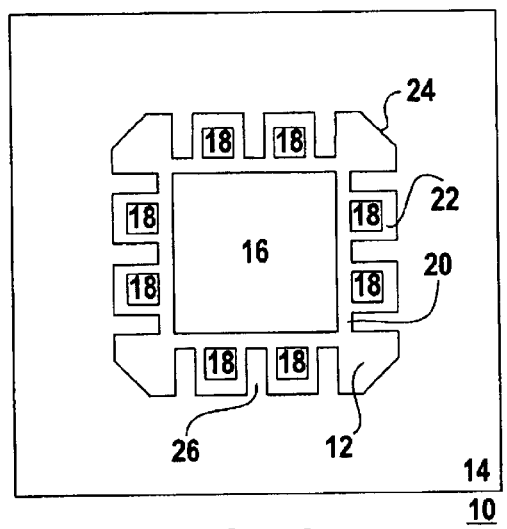
FIG. 3 is a top plan view of a second embodiment of the stiffener.

In the embodiment depicted in FIG. 3, the stiffener 14 forms minor interior apertures 22 in addition to the major interior aperture 20. The minor interior apertures 22 receive the secondary circuit structures 18, and surround the secondary circuit structures 18 on at least three sides of the secondary circuit structures 18, or in other words, surround at least three quarters of the perimeter of the secondary circuit structures 18. Thus, with fingers 26 extending between the secondary circuit structures 18, there is even more surface area of the stiffener 14 mounted to the package substrate 12, which further enhances the structural strength of the packaged integrated circuit 10. In the embodiment of FIG. 3, the major interior aperture 20 is adjoined with each of the minor interior apertures 22.

Figure 4:
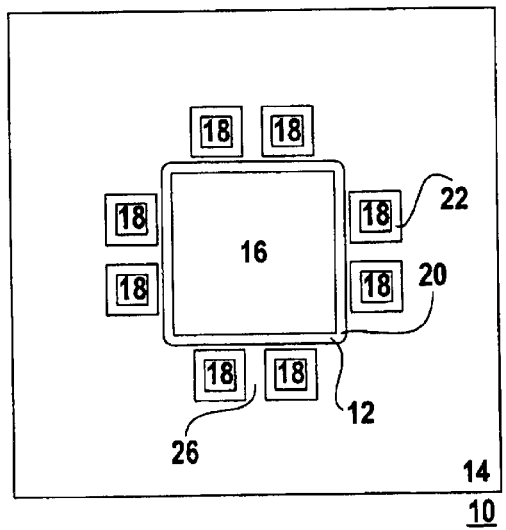
FIG. 4 is a top plan view of a third embodiment of the stiffener.

In the embodiment depicted in FIG. 4, the stiffener 14 forms separate minor interior apertures 22 around each individual secondary circuit structure 18, which minor interior apertures 22 are not adjoined to the major interior aperture 20. Thus, in this embodiment there is an even greater amount of surface area of the stiffener 14 that can be mounted to the package substrate 12, and which again further enhances the structural strength of the packaged integrated circuit 10.

The minor interior apertures 22 are preferably about four millimeters square in size. However, it is appreciated that the size of the various apertures 20 and 22 and the stiffener 14 itself is primarily dependent upon the size of the elements which they must receive and surround. Preferably, the stiffener 14 and apertures 20 and 22 are sized so as to maximize the surface area of the stiffener 14 that can be mounted to the package substrate 12, so as reduce twisting and warping as much as possible.

Figure 5:
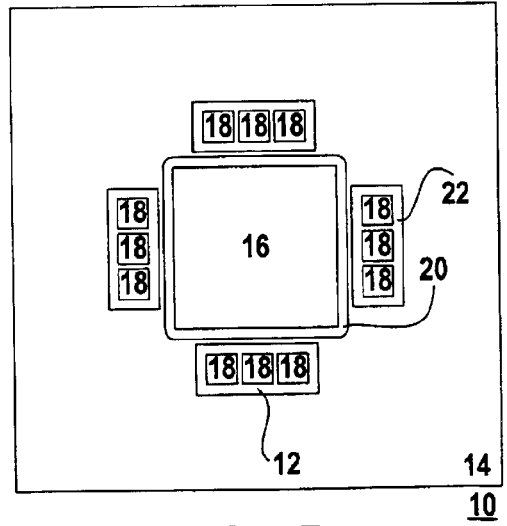
FIG. 5 is a top plan view of a fourth embodiment of the stiffener.

The embodiment of FIG. 5 depicts minor interior apertures 22 which are not adjoined to the major interior aperture 20, but which each contain more than one of the secondary circuit structures 18. Thus, it is appreciated that there are many different embodiments in accordance with the present invention, of which the figures necessarily show just a few.

However, in any embodiment with just a single major interior aperture 20 and no minor interior apertures 22, the corners of the major interior aperture 20 will have bevels 24. In all embodiments, the major interior aperture 20 of the stiffener 14 completely surrounds all sides of the integrated circuit 16. In all embodiments having minor interior apertures 22, the minor interior apertures 22 surround three quarters of the exposed perimeter of each of the secondary circuit structures 18. It is appreciated that there may be circumstances in which the secondary circuit structures 18 are so close to each other that only a portion of the perimeter of a given secondary circuit structure 18 is exposed, such as in FIG. 5.

If space on the package substrate 12 permits, the embodiment of FIG. 4 is most preferred because of the large amount of surface area of the stiffener 14 that can be bonded to the package substrate 12. If there is insufficient space available for the embodiment of FIG. 4, then the embodiment of FIG. 3 is preferred.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A stiffener for reinforcing a package integrated circuit, the stiffener comprising:

a rigid, planar, wholly electrically conductive element having a first surface for bonding to a package substrate, the rigid planar element forming a major interior aperture extending completely through the rigid planar element, for receiving and surrounding an integrated circuit on all sides of the integrated circuit, and the rigid planar element forming a minor interior aperture extending completely through the rigid planar element, for receiving and surrounding a secondary circuit structure on at least three sides of the secondary circuit structure.

2. The stiffener of claim 1, wherein the rigid planar element forms a plurality of minor interior apertures for receiving and surrounding a plurality of secondary circuit structures on at least three sides of each of the secondary circuit structures.

3. The stiffener of claim 1, wherein the minor interior aperture formed by the rigid planar element surrounds the secondary circuit structure on all sides of the secondary circuit structure.

4. The stiffener of claim 1, wherein the stiffener is formed of metal.

5. The stiffener of claim 1, wherein the stiffener is formed of copper.

6. The stiffener of claim 1, wherein the stiffener is about fifty millimeters square in size.

7. The stiffener of claim 1, wherein the stiffener is about six hundred and forty-five microns in thickness.

8. The stiffener of claim 1, wherein the major interior aperture is about twenty-two millimeters square in size.

9. The stiffener of claim 1, wherein the minor interior aperture is about four millimeters square in size.

10. The stiffener of claim 1, wherein the major interior aperture adjoins the minor interior aperture.

11. A stiffener for reinforcing a package integrated circuit, the stiffener comprising:

a rigid, planar, wholly electrically conductive element having a first surface for bonding to a package substrate, and the rigid planar element forming a major interior aperture extending completely through the rigid planar element, for receiving and surrounding an integrated circuit on all sides of the integrated circuit, the major interior aperture having beveled corners.

12. A packaged integrated circuit, comprising:

a package substrate, a monolithic integrated circuit mounted at one surface to the package substrate, with electrical connections formed between the monolithic integrated circuit and the package substrate, a secondary circuit structure mounted at one surface to the package substrate, with electrical connections formed between the secondary circuit structure and the package substrate, an electrically conductive stiffener mounted to the package substrate for reinforcing the packaged integrated circuit, the stiffener forming a major interior aperture extending completely through the stiffener, for receiving and surrounding the integrated circuit on all sides of the integrated circuit, and the stiffener also forming a minor interior aperture extending completely through the stiffener, for receiving and surrounding the secondary circuit structure on at least three sides of the secondary circuit structure, where the stiffener is not directly physically connected to either the monolithic integrated circuit or the secondary circuit structure, and a cover enclosing the integrated circuit and the secondary circuit.

13. The packaged integrated circuit of claim 12, wherein the stiffener forms a plurality of minor interior apertures for receiving and surrounding a plurality of secondary circuit structures on at least three sides of each of the secondary circuit structures.

14. The packaged integrated circuit of claim 12, wherein the minor interior aperture formed by the stiffener surrounds the secondary circuit structure on all sides of the secondary circuit structure.

15. The packaged integrated circuit of claim 12, wherein the stiffener is formed of metal.

16. The packaged integrated circuit of claim 12, wherein the stiffener is formed of copper.

17. The packaged integrated circuit of claim 12, wherein the stiffener is about fifty millimeters square in size.

18. The packaged integrated circuit of claim 12, wherein the stiffener is about six hundred and forty-five microns in thickness.

19. The packaged integrated circuit of claim 12, wherein the major interior aperture is about twenty-two millimeters square in size.

20. The packaged integrated circuit of claim 12, wherein the minor interior aperture is about four millimeters square in size.

* * * * *